US011764770B2

(12) United States Patent
Gajda et al.

(10) Patent No.: US 11,764,770 B2
(45) Date of Patent: Sep. 19, 2023

(54) CLOCK SELECTOR CIRCUIT

(71) Applicant: Nordic Semiconductor ASA, Trondheim (NO)

(72) Inventors: Bartosz Gajda, Trondheim (NO); Frode Pedersen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/785,848

(22) PCT Filed: Dec. 16, 2020

(86) PCT No.: PCT/EP2020/086522
§ 371 (c)(1),
(2) Date: Jun. 15, 2022

(87) PCT Pub. No.: WO2021/122816
PCT Pub. Date: Jun. 24, 2021

(65) Prior Publication Data
US 2023/0012226 A1    Jan. 12, 2023

(30) Foreign Application Priority Data

Dec. 20, 2019    (GB) .................................... 1918998

(51) Int. Cl.
*H03K 3/00*    (2006.01)
*H03K 5/135*    (2006.01)
(Continued)

(52) U.S. Cl.
CPC ............... *H03K 5/135* (2013.01); *G06F 1/08* (2013.01); *H03K 3/037* (2013.01); *H03K 5/26* (2013.01)

(58) Field of Classification Search
CPC .......... H03K 5/135; H03K 3/037; H03K 5/26; G06F 1/08
(Continued)

(56) References Cited

U.S. PATENT DOCUMENTS 5,357,146 A    10/1994 Heimann
5,381,542 A    1/1995 Carlson
(Continued)

FOREIGN PATENT DOCUMENTS

WO    WO 2021/122816 A1    6/2021

OTHER PUBLICATIONS

International Search Report and Written Opinion for PCT/EP2020/086522, dated Apr. 21, 2021, 15 pages.
(Continued)

*Primary Examiner* — Ryan Jager
(74) *Attorney, Agent, or Firm* — Klarquist Sparkman, LLP

(57) ABSTRACT

A clock selector circuit receives a first input clock signal (CLK1) having a first frequency, and a second input clock signal (CLK2) having a second frequency. A phase difference detector is configured to detect when a phase difference occurs, over time, between the first input clock signal (CLK1) and the second input clock signal (CLK2), determined using when a clock edge crosses zero, and to signal this zero crossing to switching circuitry. The switching circuitry is configured, in response to receiving a zero-crossing signal from the phase difference detector, to detect an edge of opposite type to the predetermined type in the first input clock signal (CLK1) or in the second input clock signal (CLK2), and, in response to detecting said edge of opposite type, to switch an output clock signal (CLK_OUT) between the first input clock signal (CLK1) and the second input clock signal (CLK2).

15 Claims, 2 Drawing Sheets

(51) Int. Cl.
    *G06F 1/08* (2006.01)
    *H03K 3/037* (2006.01)
    *H03K 5/26* (2006.01)

(58) Field of Classification Search
    USPC ........................................................ 327/293
    See application file for complete search history.

(56) References Cited

U.S. PATENT DOCUMENTS

| | | | |
|---|---|---|---|
| 6,163,583 | A | 12/2000 | Lin et al. |
| 6,429,698 | B1 | 8/2002 | Young |
| 6,653,867 | B1 | 11/2003 | Shihadeh |
| 6,806,755 | B1 * | 10/2004 | Simmonds ................ G06F 1/08 327/99 |
| 7,911,239 | B2 | 3/2011 | Saint-Laurent et al. |
| 10,727,854 | B1 * | 7/2020 | Greshishchev ..... H03M 1/0836 |
| 11,637,550 | B2 * | 4/2023 | Berg ...................... H03K 5/135 327/122 |
| 2005/0012530 | A1 * | 1/2005 | Hashimoto ............... G06F 1/08 327/141 |
| 2005/0017763 | A1 | 1/2005 | Slobodnik et al. |
| 2008/0012605 | A1 | 1/2008 | Cheung |
| 2014/0306741 | A1 * | 10/2014 | Grabinski ............... H03L 7/087 327/156 |
| 2015/0227162 | A1 * | 8/2015 | Zhu .......................... H03K 5/14 331/49 |
| 2017/0177020 | A1 | 6/2017 | Mukherji et al. |
| 2022/0286122 | A1 * | 9/2022 | Berg ...................... H03K 4/026 |
| 2023/0012226 | A1 * | 1/2023 | Gajda ...................... H03K 5/26 |

OTHER PUBLICATIONS

IPO Search Report under Section 17(5) for GB1918998.4, dated May 15, 2020, 3 pages.
Renesas Electronics Corporation, "Zero Delay Glitch-Free Clock Multiplexer," © Renesas Electronics Corporation, ICS581-01/02, Mar. 2020, 11 pages.
Zhang et al., "An improved fast acquisition phase frequency detector for high speed phase-locked loops," *AIP Conference Proceedings* 1955, 040030 (2018); https://doi.org/10.1063/1.5033694, Published Online: Apr. 18, 2018.

* cited by examiner

CLOCK SELECTOR CIRCUIT

CROSS REFERENCE TO RELATED APPLICATIONS

This is the U.S. National Stage of International Application No. PCT/EP2020/086522, filed Dec. 16, 2020, which was published in English under PCT Article 21(2), which in turn claims the benefit of Great Britain Application No. 1918998.4, filed Dec. 20, 2019.

BACKGROUND OF THE INVENTION

This invention relates to a clock selector circuit.

Clock signals are used to coordinate the action of electronic circuits, especially integrated circuits. Typically, a periodic signal is generated by a quartz crystal oscillator and is distributed to clocked circuit elements, such as D-type flip-flops, over one or more clock wires in the electronic circuit. The periodic signal may be used directly as a clock signal, or the electronic circuit may derive a clock signal from the period signal—e.g. using clock multiplier or divider circuits. The clock signal is typically a single-phase square wave signal.

Quartz crystal oscillators are often used to generate high-frequency and high-accuracy clock signals. However, crystal oscillators consume considerable power. Resistor-capacitor (RC) oscillators can generate clock signals more efficiently than crystal oscillators. They can also conveniently be integrated into the same chip as other circuit elements. However, RC oscillators are generally less accurate than crystals, being more affected by changes in temperature and supply voltage. Feedback and control mechanisms can mitigate this to an extent, but RC oscillators are still typically less accurate than high-quality crystal oscillators.

It can therefore be advantageous to provide an electronic device, such as a battery-powered Internet-of-Things (IoT) sensor, with multiple clock sources—e.g. both a crystal oscillator and an RC oscillator. The device can then switch between the clock sources, when clocking the same circuitry, depending on requirements. For example, a system-on-chip (SoC) device may be configured to use a highly accurate clock derived from a crystal oscillator when an on-chip analog-to-digital (ADC) peripheral, requiring high clock purity, is active, and to use a clock derived from a lower-power RC oscillator at other times such as when the device is in a sleep state.

Clock signals derived from different oscillators can have the same nominal frequency, but they will not typically be aligned in phase. It is therefore not straightforward to switch an electronic circuit seamlessly from using one clock signal to using a different clock signal, as the resultant output clock signal can include switching artefacts, with at least one clock cycle being distorted—e.g. shortened or lengthened. Such artefacts can cause the frequency of the output clock signal to shift outside a frequency range specified for the circuit, resulting in errors, which may be intermittent or unpredictable and therefore hard to debug.

The present invention provides a clock selector circuit for improved switching between clock signals.

SUMMARY OF THE INVENTION

From a first aspect, the invention provides a clock selector circuit comprising:

a first input for receiving a first input clock signal having a first frequency;
a second input for receiving a second input clock signal having a second frequency, wherein the second frequency differs from the first frequency by a frequency offset;
a clock output for outputting an output clock signal;
a phase difference detector; and
switching circuitry,
wherein the phase difference detector is configured to detect when a phase difference, over time, between the first input clock signal and the second input clock signal, determined using a predetermined type of clock edge, being either a rising edge or a falling edge, crosses zero, and to signal this zero crossing to the switching circuitry, and wherein the switching circuitry is configured, in response to receiving a zero-crossing signal from the phase difference detector, to detect an edge of opposite type to the predetermined type in the first input clock signal or in the second input clock signal, and, in response to detecting said edge of opposite type, to switch the output clock signal between the first input clock signal and the second input clock signal.

From a second aspect, the invention provides a clock switching method, comprising:

receiving a first input clock signal having a first frequency;
receiving a second input clock signal having a second frequency, wherein the second frequency differs from the first frequency by a frequency offset;
outputting one of the first and second input clock signals as an output clock signal;
using a predetermined type of clock edge, being either a rising edge or a falling edge, detecting a phase difference, over time, between the first input clock signal and the second input clock signal crossing zero;
in response to detecting the phase difference crossing zero, detecting an edge of opposite type to the predetermined type in the first input clock signal or in the second input clock signal; and
in response to detecting said edge of opposite type, switching to outputting the other of the first and second input clock signals as the output clock signal.

Thus it will be seen that, in accordance with the invention, two input clock signals are set to be offset from each other in frequency, at least around the time of the switching, such that there is a phase difference between the clock signals that changes over time (typically linearly if the frequency offset remains constant). The clock selector circuit uses a phase difference detector to detect when the two clocks signals are closely aligned in phase by determining when the rising edges (or, alternatively, the falling edges) of the two input clock signals cross over in time, such that the second clock signal begins to lead the first clock signal, having previously trailed the first clock signal, or vice versa. On detecting this phase crossing, the clock selector circuit switches the output from one input clock signal to the other input clock signal, with the switch being triggered by a subsequent falling edge of one of the clock signals (or, alternatively, a subsequent rising edge). In this way, the actual switching operation can be spaced away in time from the rising (or falling) edges, to minimize the risk of the switching interfering with any rising (or falling) edge in the output clock signal. Note that the phase difference crosses zero every time the phase difference wraps modulo $2\pi$; this may occur in either a positive or a negative direction.

In this way, a seamless switching between the two input clock signals is possible, in which the output clock signal does not contain any substantially shortened or lengthened clock cycle that might otherwise cause the frequency of the output clock signal to shift outside tolerable limits. This allows a device to use the output clock signal continuously, without having to stall a processor or other circuitry that uses the output clock signal in order to mitigate the risk of a lost or corrupt clock cycle.

The clock selector circuit achieves this without requiring a third input clock signal, operating at a much higher frequency than the first and second input clock signals, to coordinate the switching process (e.g. operating at hundreds of MHz if the frequencies of the first and second input clocks are both around 16 MHz). Such a higher-frequency third clock signal may not be available on many devices. Even if a higher-frequency clock source is available, using it to control a switching between two lower-frequency clock signals is likely to increase power consumption and complexity, and present additional design constraints. Instead, embodiments of the present clock selector circuit can operate using only the timing provided by the first and second input clock signals themselves.

The first and second clock signals preferably have similar frequencies. The frequency offset may be less than 10% or less than 1% of less than 0.5% of the first frequency. In this way, the output clock signal can have a constant nominal frequency within a predetermined tolerance (e.g. +/−10% or 1% or 0.5%), regardless of which input clock signal is being output. In some embodiments, the first and second clock signals both have a frequency in the range 16 MHz+/−10% or +/−1% or +/−0.5%. However, the frequency offset may be at least 0.01% or at least 0.1% of the first frequency, to ensure that there is not an excessive delay before the phases next cross; in this way, the switching can occur in a timely manner after the clock selector circuit receives a command to switch between the clock signals.

The frequency offset may be constant over a time window, which may span a plurality of cycles of the output clock signal. The switching of the output clock signal may occur during this time window. In some embodiments, the frequency offset may have a lower value before and/or after the time window during which the switching occurs than it does during the time window. It may be less than 0.1% or less than 0.01% of the first frequency—e.g. a zero offset—outside the switching window The first and second input clock signals may be square-wave signals.

The first input clock signal may be generated using a crystal oscillator. The second input clock signal may be generated using a resistor-capacitor (RC) or inductor-capacitor (LC) oscillator. The second input clock signal may be generated using a controllable oscillator, such as a voltage controlled oscillator (VCO) or a digitally controlled oscillator (DCO).

The clock selector circuit may comprise an output for sending a control signal to a controllable oscillator. The controllable oscillator may be used to generate the second input clock signal. The clock selector circuit may comprise control logic for generating and/or sending a control signal to the controllable oscillator. The control logic may be configured to send a first control signal to the controllable oscillator to cause the second frequency to equal the first frequency during a first period, and to send a second control signal to the controllable oscillator to offset the second frequency from the first frequency by the frequency offset during a second period. The output clock signal may be set constantly to one of the first and second input clock signals during the first period, and may be switched to the other of the first and second input clock signals within the second period. The control logic may be further configured, when switching from the first input clock signal to the second input clock signal, to send a third control signal to the controllable oscillator to cause the second frequency to equal the first frequency again during a third period, after the second period. Thus, the frequency of the output clock signal may be offset from a nominal frequency of the first input clock signal (which may be derived from a crystal oscillator) around the time of the switching, in order for the phase alignment process to occur, but may revert to the nominal frequency after the switching has completed.

In some embodiments, the second input clock signal may be calibrated against the first input clock signal at intervals. This calibration may be performed by calibration logic which may be part of the clock selector circuit or which may be separate. The control logic may use calibration data determined by the calibration logic when determining a control signal to send to the controllable oscillator to cause the second frequency to be offset from the first frequency by the offset amount.

The phase difference detector may comprise an analog or digital phase detector. It may comprise one or more flip-flops. It may comprise or consist of a D-type flip-flop, which may be clocked on the predetermined type of clock edge. The D-type flip-flop may receive one of the first and second input clock signals as a clock input. The D-type flip-flop may receive the other of the first and second input clock signals as a data input (D). In this way, an output (Q) of the D-type flip-flop may signal when the phase difference has crossed zero, by changing from high to low (or vice versa). This signal may be passed to switching circuitry—e.g. along a one-bit signal line.

The switching circuitry may comprise a multiplexer. It may comprise a digital controller for sending a select signal to the multiplexer. The switching circuitry may also comprise the control logic for generating and sending control signals to the controllable oscillator. The digital controller may send a select signal to the multiplexer in response to receiving the zero-crossing signal from the phase difference detector. It may send the select signal within less than one cycle of the output clock signal.

The switching circuitry (e.g. the digital controller) may comprise circuitry for detecting the edge of opposite type to the predetermined type in the first input clock signal or in the second input clock signal. This circuitry may comprise one or more logic gates or flip-flops. The switching circuitry may be configured to detect the first (i.e. next) edge of opposite type in the first input clock signal (or in the second input clock signal) after the phase difference detector has detected the zero crossing. The switching circuitry may be configured to switch the output clock signal between the first input clock signal and the second input clock signal before receiving the first (i.e. next) edge of the predetermined type in the first and/or second input clock signals after detecting that the phase difference has crossed zero. In this way, the switching of the output clock signal can advantageously occur within one clock cycle of the phase crossing being detected—i.e. while the phases of the first and second input clock signals are still closely aligned.

The switching circuitry may be configured to detect the later-arriving edge of opposite type of the first edges of opposite type received in the first and second input clock signals after the phase difference detector has detected the phase difference crossing zero. Thus, both input clock signals will be in the same state (high or low) upon this detection, and so switching at this point reduces the risk of any glitches being introduced.

The clock selector circuit (e.g. control logic within the clock selector circuit) may comprise a control input for receiving a switching command—e.g. from a processor. The clock selector circuit may perform the switching in response to receiving a switching command. The clock selector circuit may comprise control logic configured to send a control signal to a controllable oscillator to cause the second frequency to be offset from the first frequency by the frequency offset in response to receiving the switching command.

The clock selector circuit may be part of an electronic apparatus. It may be at least partly integrated on an integrated-circuit chip, e.g. on a silicon wafer. It may be part of a system-on-chip device. From a further aspect, the invention provides an electronic apparatus comprising the clock selector circuit. The electronic apparatus may comprise one or more quartz crystals, which may be used to generate the first input clock signal. The electronic apparatus may comprise one or more RC or LC oscillators, which may be configured to generate the first and/or second input clock signals.

The output clock signal may be connected to circuitry that is arranged to be clocked by the output clock signal. This may include a processor, a peripheral, etc. The circuitry may be arranged to be clocked using the predetermined type of clock edge. In some embodiments the predetermined type of clock edge is a rising edge; the switching will then occurs close to the falling edges of the nearly-phase-aligned input clock signals, thereby lessening the risk of affecting the rising edges which are used to clock the connected circuitry.

The terms "circuit" and "circuitry" as used herein may refer to open circuits or to closed circuits; i.e. they encompass circuit portions that may form part of a closed circuit when connected to other elements such as a power supply.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1:
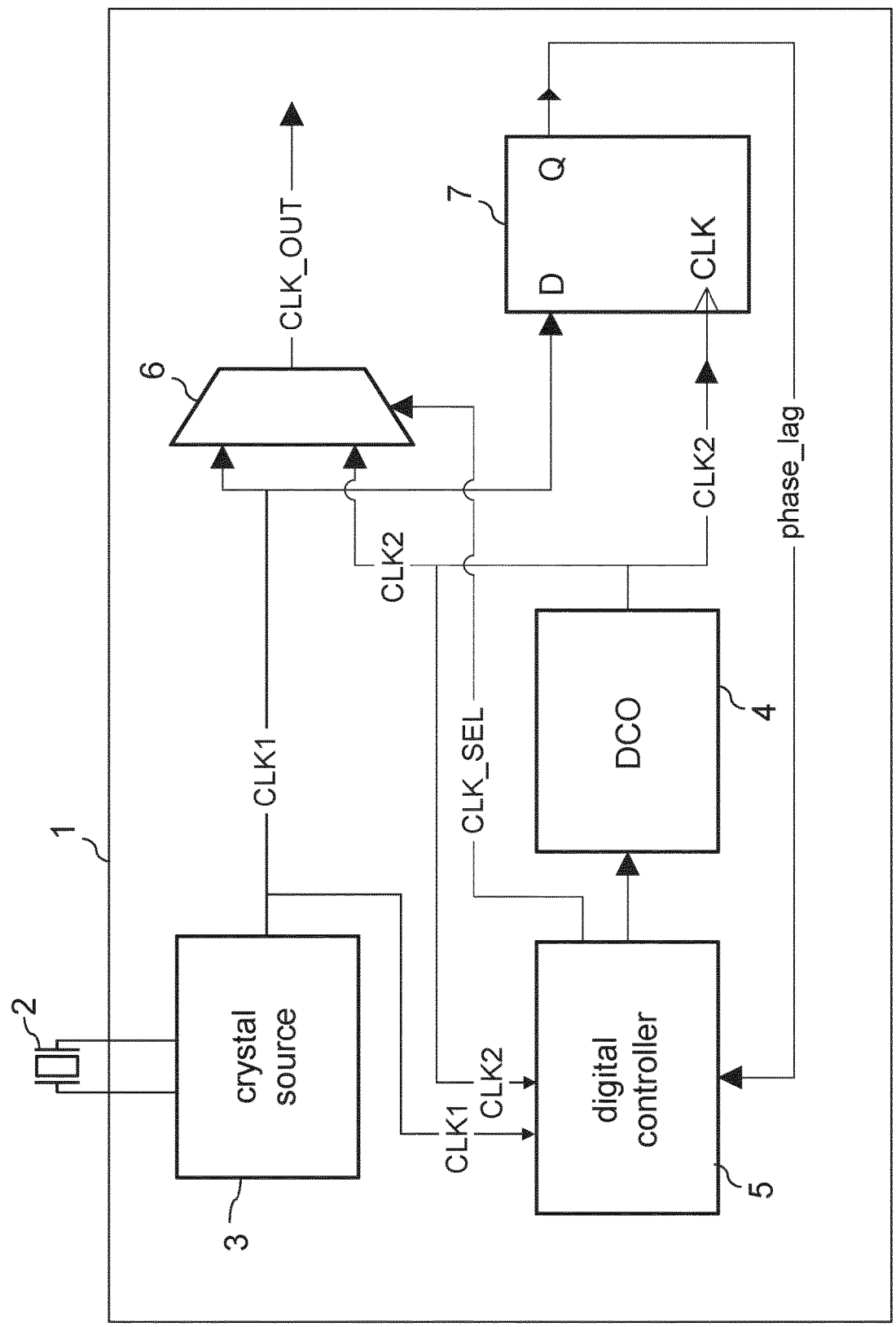
FIG. 1 is a schematic drawing of a system-on-chip device showing the main components of a clock selector circuit embodying the invention.

FIG. 1 shows a system-on-chip (SoC) 1. This SoC could, for example, be a radio-on-a-chip component, contained within a wireless device such as a temperature sensor, for controlling operations of the sensor and the exchange of sensor readings with a remote device over a radio link.

The SoC 1 will typically be connected to various off-chip components, such as a power supply (e.g. batteries), interfaces, sensors, capacitors, resistors, inductors, etc. These are omitted from FIG. 1 for simplicity. One off-chip component that is shown, however, is a quartz crystal 2, which may have a nominal frequency of 32 MHz. The crystal 2 is connected to a crystal source circuit 3 within the SoC 1, which uses the quartz crystal to generate a clock signal CLK1 suitable for timing one or more clock domains within the SoC. The clock signal CLK 1 may be downscaled by the crystal source circuit 3, e.g. to 16 MHz.

A second clock signal CLK2 can be generated by a digitally-controlled oscillator (DCO) 4, containing a resistor-capacitor (RC) oscillator. The frequency of the signal output by the DCO 4 can be controlled by a digital controller 5. The digital controller 5 comprises hard-wired logic implementing a finite state machine. In some embodiments, the digital controller 5 may also include a processor for executing software instructions; in other embodiments the digital controller 5 is a peripheral which may receive commands from a separate processor, e.g. received over a bus system via a register interface. The DCO 4 may be designed to output a frequency of around 16 MHz, but controllable above and below this value by the digital controller 5.

The SoC may contain calibration circuitry (not shown) for calibrating the DCO 4, at intervals, against the crystal source 3, or against a different crystal source (e.g. a 32 kHz crystal), to determine a trim value for the DCO 4 that would cause the DCO 4 to output a signal CLK2 at the same frequency as the 16 MHz signal CLK1 output by the crystal source 3. However, when performing clock switching, the frequency of the signal CLK2 will be intentionally offset from the frequency of the crystal source 3 output signal CLK1.

The digital controller 5 also has an output line for sending a clock select signal CLK_SEL to a multiplexer 6. The digital controller 5 and the multiplexer 6 together embody the switching circuitry disclosed herein. This multiplexer 6 has a first input for receiving the clock signal CLK1 from the crystal source 3, and a second input for receiving the clock signal CLK2 from the DCO 4. It has an output for outputting a clock out signal CLK_OUT, which is equal to one of the two input signals CLK1 & CLK2. Which input is selected by the multiplexer 6 depends on the state of the binary clock select signal CLK_SEL which the multiplexer 6 receives from the digital controller 5. This output signal CLK_OUT can be routed to parts of the SoC 1 as required. It may be used to clock a processor and/or one or more peripherals, such as a baseband processor of a radio, an analog-to-digital converter (ADC), etc. The SoC 1 may, of course, have other crystal or RC clock sources (not shown), for providing appropriate clock signals to other parts of the chip.

The clock switching circuit also includes a rising-edge-triggered D-type flip-flop (DFF) 7 which acts as a phase detector. The DFF is clocked by the DCO 4 clock signal CLK2, and receives the crystal clock signal CLK1 as a data "D" input. The output "Q" is provided to the digital controller 5 as a binary signal "phase_lag" which changes state each time the phase difference between the two inputs crosses zero.

The digital controller 5, multiplexer 6 and DFF 7 together form a clock selector circuit. In use, they enable the CLK_OUT signal to be switched seamlessly from the crystal clock CLK1 to the RC oscillator clock signal CLK2, and vice versa, such that the frequency of the output signal CLK_OUT stays within a required tolerance of a nominal frequency (e.g. 16 MHz). They accomplish this by ensuring that the actual switching point occurs at a precisely determined moment in time.

The digital controller 5 will typically idle until software executing on a processor of the SoC 1 determines that a change of clock source is required. The processor may then write a command to switch the clocks to an input register of the digital controller 5. When the digital controller 5 receives a command to switch between the clock sources (e.g. from software executing on a processor on the SoC 1), it first ensures both clock sources 3, 4 are powered on and then sends a digital frequency control word to the DCO 4 that causes the frequency of the DCO 4 output signal CLK2 to be skewed slightly away from its calibrated value in which it is substantially equal to the crystal signal CLK1—e.g. increasing the frequency of CLK2 by about 0.2% from 16.00 MHz to around 16.03 MHz.

Whenever both clocks 3, 4 are active, the DFF 7 will output a phase_lag signal that is high whenever the rising edge of the DCO 4 output CKL2 occurs within the first half period of the crystal signal CLK1, after CLK1's rising edge, and that is low whenever the rising edge of the DCO 4 output CKL2 occurs within the second half period of the crystal signal CLK1, after CLK1's rising edge. If CLK2 is set to a slightly higher frequency than CLK1 (i.e. a shorter period), then the phase_lag signal will change from high to low as, or in the next CLK2 cycle after, the phase difference between CLK1 and CLK2 crosses zero. (It will change back from low to high when the phase difference crosses π, but this detection is not used.) If, alternatively, CLK2 is set to a slightly lower frequency than CLK1 (i.e. a longer period), then the phase_lag signal will change from low to high whenever the phase difference between CLK1 and CLK2 crosses zero.

The phase_lag signal is received by the digital controller 5. Assuming the controller 5 has offset the frequency of CLK2 above that of CLK1, the controller 5 detects when the phase_lag signal goes low. It responds by waiting to detect the next falling edge in one or both of the CLK1 or CLK2 signals. It may use a falling-edge-triggered D-type flip-flop to implement this detection. It may detect when both clocks signals go low, or, if CLK2 is always skewed to a higher frequency than CLK1, the falling edge of CLK2 should lead the falling edge of CLK1 in the next cycle after the phase difference crosses zero, and so the digital controller 5 may instead be configured to switch on the next falling edge of CLK1 after receiving the CLK_SEL signal. Upon detecting the falling edge or edges, the controller 5 immediately (in under half a clock cycle) toggles the CLK_SEL line to the multiplexer 6, causing the multiplexer 6 to switch to outputting CLK1 or to outputting CLK2. The digital controller 5 then returns to an idle state, in which it waits to receive a further switch command from the processor.

Figure 2:
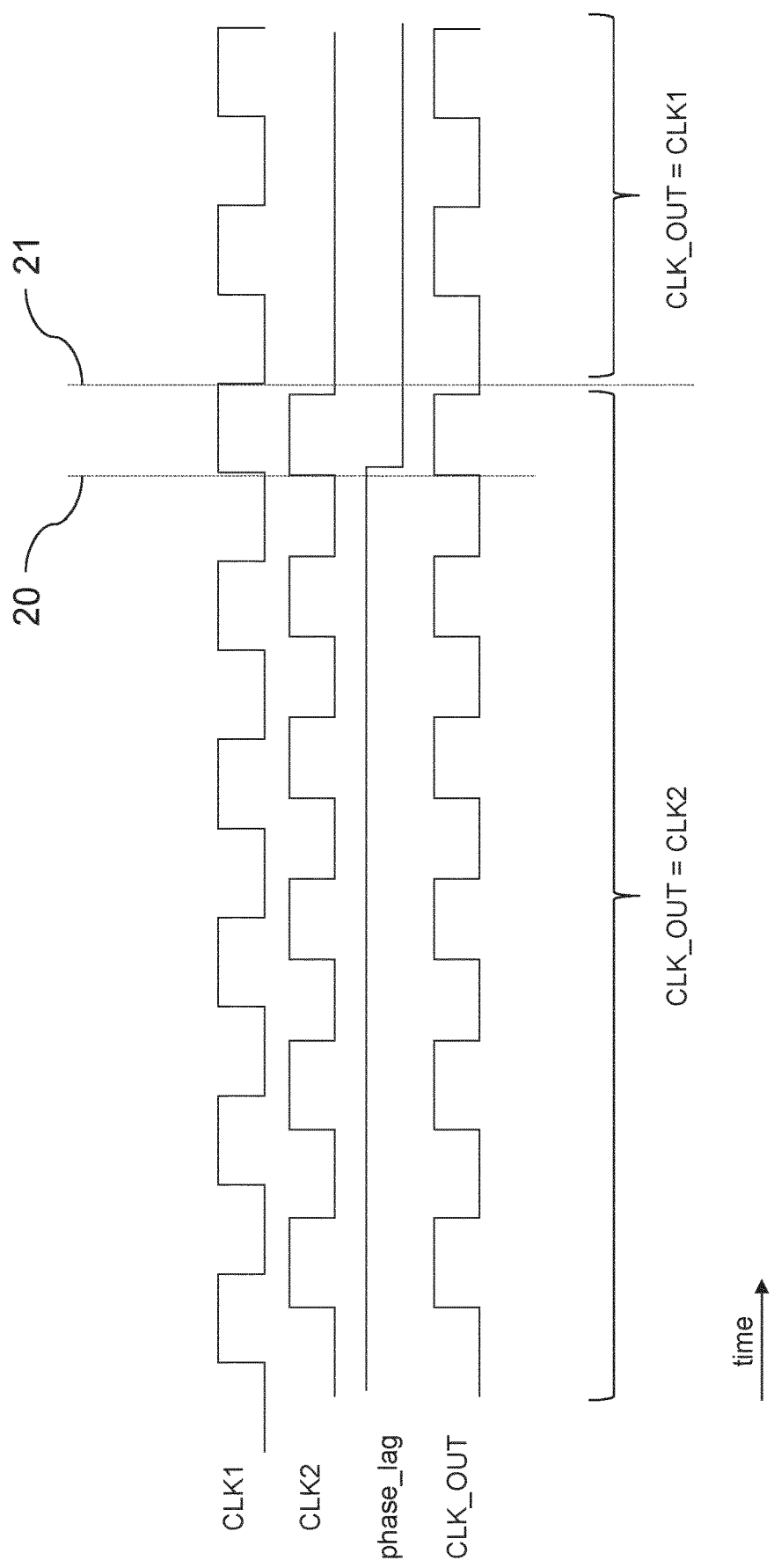
FIG. 2 is a timing diagram of signals within the clock selector circuit during a switching operation.

FIG. 2 is a timing diagram which shows how, by skewing the frequency of CLK2 to be slightly higher than that of CLK1, a phase sliding effect occurs over time, which causes the rising edges of the two clock signals to move with relation to each other. The rate of change of the phase difference is proportional to the amount of constant frequency offset that is present between the two signals CLK1, CLK2. In particular, the rising edge of CLK2 occurs at an earlier (further leftward) position in each successive CLK1 cycle, until eventually it changes from occurring shortly after each rising edge of the CLK1 signal to coinciding with, or shortly preceding, the rising edge of CLK1. The time at which this is detected by the DFF 7 is marked by a dashed line 20 in FIG. 2. At this moment, the phase_lag signal from the output Q of the DFF will change from high to low. The change is clocked by the rising edge of the DCO signal CLK2, which is provided to the clock input of the DFF 7. Thus the DFF 7 detects, within a maximum of one CLK2 clock cycle, when the phase difference between the two clock signals CLK1, CLK2 has crossed zero—i.e. when the phase difference has changed from positive to negative (or vice versa), when considering the phase difference in the range −π to π, modulo 2π.

A second line 21 in FIG. 2 indicates the time at which the multiplexer 6 switches from the crystal clock signal CLK1 to the DCO signal CLK2, or vice versa. This is clocked by the later of the two falling edges in the CLK1 and CLK2 input signals that the digital controller 5 receives, whereupon the digital controller 5 sends the CLK_SEL signal to the multiplexer 6 (which, in this example, is the falling edge of CLK1). In this way, even if there is some lag in the switching, a clean switch can be ensured, so long as any delay is less than a half of one clock period.

FIG. 2 shows the output signal CLK_OUT from the multiplexer 6. In this example, CLK_OUT is set to the DCO 4 signal CLK2 initially, and is switched to the crystal signal CLK1 at the first falling edge after the phase difference crosses zero.

When switching from the DCO signal CLK2 to the crystal signal CLK1, as in the example of FIG. 2, the digital controller 5 may then optionally power down DCO 4, to reduce power consumption for the SoC 1 overall, if it is not needed. However, the power saving may not justify doing so, e.g. it may be desirable to keep recalibrating the DCO 4 against the crystal 2 at intervals, in embodiments that can do this, so that the DCO 4 is ready to take over if a command is received to switch back to using the DCO 4.

When switching from the crystal signal CLK1 to the DCO signal CLK2, the digital controller 5 may power down the crystal 2 and its associated circuitry 3, to reduce power consumption for the SoC 1 overall, if it is not required for anything else. Also, the digital controller 5 may, after the switch, send a further control word to the DCO 4 to remove the frequency skew and set the DCO 4 to the calibrated nominal value.

It will be appreciated by those skilled in the art that the invention has been illustrated by describing one or more specific embodiments thereof, but is not limited to these embodiments; many variations and modifications are possible, within the scope of the accompanying claims.

In particular, the clock switching circuit does not require one of the clock signals to be a crystal signal and the other to be from an RC oscillator. The same principles could be used to switch between two clock signals generated from different RC oscillators, or from any other clock sources. Switching between two crystals may be less useful, and may be hard to achieve in practice, as it may be hard to provide an appropriate frequency offset (skew).

The multiplexer could receive three or more clock signals as inputs. It may be able to switch the output from any one input clock to any other input clock. In this case, the phase detector logic may be able to detect a phase-difference zero crossing between any pair of the input clock signals, and to use this to trigger a switch from one of the pair to the other of the pair.

In some embodiments, the phase crossing detection could be performed on the falling edge of one of the clock signals (e.g. CLK2), with the multiplexer switching being timed by the next rising edge. This may be particularly useful if the output clock signal from the multiplexer is sent to falling-edge-timed circuitry, as it can ensure that any switching noise from the multiplexer is kept far away from the falling edges of the output clock signal. Alternatively, an inverter could be placed after the output of the multiplexer 6 for clocking falling-edge-timed circuitry.

The invention claimed is:
1. A clock selector circuit comprising:
   a first input for receiving a first input clock signal having a first frequency;

a second input for receiving a second input clock signal having a second frequency, wherein the second frequency differs from the first frequency by a frequency offset;

a clock output for outputting an output clock signal;

a phase difference detector; and switching circuitry, wherein the phase difference detector is configured to detect when a phase difference, over time, between the first input clock signal and the second input clock signal, determined using a predetermined type of clock edge, being either a rising edge or a falling edge, crosses zero, and to signal this zero crossing to the switching circuitry, and wherein the switching circuitry is configured, in response to receiving a zero-crossing signal from the phase difference detector, to detect an edge of opposite type to the predetermined type in the first input clock signal or in the second input clock signal, and, in response to detecting said edge of opposite type, to switch the output clock signal between the first input clock signal and the second input clock signal.

2. The clock selector circuit of claim 1, wherein the frequency offset is less than 10% of the first frequency.

3. The clock selector circuit of claim 1, wherein the frequency offset is constant over a time window that spans a plurality of cycles of the output clock signal and wherein the switching of the output clock signal occurs during this time window.

4. The clock selector circuit of claim 1, wherein the first input clock signal is generated using a crystal oscillator and wherein the second input clock signal is generated using a resistor-capacitor (RC) or inductor-capacitor (LC) oscillator.

5. The clock selector circuit of claim 1, wherein the second input clock signal is generated using a controllable oscillator and wherein the clock selector circuit comprises control logic for sending a control signal to a controllable oscillator.

6. The clock selector circuit of claim 5, wherein the control logic is configured to send a first control signal to the controllable oscillator to cause the second frequency to equal the first frequency during a first period, and to send a second control signal to the controllable oscillator to offset the second frequency from the first frequency by the frequency offset during a second period.

7. The clock selector circuit of claim 6, wherein the control logic is further configured, when switching from the first input clock signal to the second input clock signal, to send a third control signal to the controllable oscillator to cause the second frequency to equal the first frequency again during a third period, after the second period.

8. The clock selector circuit of claim 5, further comprising calibration logic for calibrating the second input clock signal against the first input clock signal at intervals, and wherein the control logic is configured to use calibration data determined by the calibration logic to determine a control signal to send to the controllable oscillator to cause the second frequency to be offset from the first frequency by the offset amount.

9. The clock selector circuit of claim 1, wherein the phase difference detector comprises a D-type flip-flop that is clocked on the predetermined type of clock edge.

10. The clock selector circuit of claim 9, wherein the D-type flip-flop is arranged to receive one of the first and second input clock signals as a clock input and to receive the other of the first and second input clock signals as a data input.

11. The clock selector circuit of claim 1, wherein the switching circuitry comprises a multiplexer and a digital controller, wherein the digital controller is configured to send a select signal to the multiplexer within less than one cycle of the output clock signal of receiving the zero-crossing signal from the phase difference detector.

12. The clock selector circuit of claim 1, wherein the switching circuitry is configured to detect the first edge of opposite type in the first input clock signal, or is configured to detect the first edge of opposite type in the second input clock signal, received by the clock selector circuit after the phase difference detector has detected the phase difference crossing zero.

13. The clock selector circuit of claim 1, wherein the switching circuitry is configured to switch the output clock signal between the first input clock signal and the second input clock signal before the clock selector circuit receives the first edge of the predetermined type in the first and/or second input clock signals after the phase difference detector has detected the phase difference crossing zero.

14. A system-on-chip device comprising the clock selector circuit of claim 1, wherein the system-on-chip device further comprises circuitry arranged to be clocked by the output clock signal output by the clock selector circuit.

15. A clock switching method, comprising:

receiving a first input clock signal having a first frequency;

receiving a second input clock signal having a second frequency, wherein the second frequency differs from the first frequency by a frequency offset;

outputting one of the first and second input clock signals as an output clock signal;

using a predetermined type of clock edge, being either a rising edge or a falling edge, detecting a phase difference, over time, between the first input clock signal and the second input clock signal crossing zero;

in response to detecting the phase difference crossing zero, detecting an edge of opposite type to the predetermined type in the first input clock signal or in the second input clock signal; and in response to detecting said edge of opposite type, switching to outputting the other of the first and second input clock signals as the output clock signal.

\* \* \* \* \*